United States Patent
Rangan et al.

(10) Patent No.: US 7,308,659 B1
(45) Date of Patent: Dec. 11, 2007

(54) APPARATUS AND METHOD FOR RTL MODELING OF A REGISTER

(75) Inventors: Gopinath Rangan, Milpitas, CA (US); Guy Dupenloup, Redwood City, CA (US); Wira Gunawan, Santa Clara, CA (US); Tzung-Chin Chang, San Jose, CA (US); Khai Nguyen, San Jose, CA (US)

(73) Assignee: Altera Corporation, San Jose, CA (US)

(*) Notice: Subject to any disclaimer, the term of this patent is extended or adjusted under 35 U.S.C. 154(b) by 811 days.

(21) Appl. No.: 10/642,084

(22) Filed: Aug. 14, 2003

(51) Int. Cl.
*G06F 17/50* (2006.01)
(52) U.S. Cl. .................. 716/5; 716/4; 716/6; 703/16
(58) Field of Classification Search .............. 716/4–6; 703/16
See application file for complete search history.

(56) References Cited

U.S. PATENT DOCUMENTS

| | | | | |
|---|---|---|---|---|
| 5,363,319 A | * | 11/1994 | Okuda | 703/15 |
| 5,371,742 A | * | 12/1994 | Brown et al. | 714/2 |
| 5,377,203 A | * | 12/1994 | Khan | 714/744 |
| 5,826,061 A | * | 10/1998 | Walp | 716/6 |
| 6,163,876 A | * | 12/2000 | Ashar et al. | 716/5 |
| 6,173,435 B1 | * | 1/2001 | Dupenloup | 716/18 |
| 6,189,133 B1 | * | 2/2001 | Durham et al. | 716/12 |
| 6,295,636 B1 | * | 9/2001 | Dupenloup | 716/18 |
| 6,408,265 B1 | * | 6/2002 | Schultz et al. | 703/22 |
| 2003/0154061 A1 | * | 8/2003 | Willis | 703/4 |
| 2004/0044514 A1 | * | 3/2004 | Granny et al. | 703/23 |

\* cited by examiner

*Primary Examiner*—Jack Chiang
*Assistant Examiner*—Naum B. Levin
(74) *Attorney, Agent, or Firm*—L. Cho

(57) ABSTRACT

The present invention is directed to reducing errors due to floating values introduced during tristate and contention when modeling a register in RTL. In one embodiment, the floating values are replaced by predetermined desired values corresponding to the floating values which are both stored in a lookup table. In another embodiment, when a floating value is detected, that value is ignored and the previous clock value is retained.

18 Claims, 7 Drawing Sheets

APPARATUS AND METHOD FOR RTL MODELING OF A REGISTER

BACKGROUND OF THE INVENTION

This invention relates to modeling registers for electronic circuit verification. More particularly, this invention relates to a method of modeling a register at register transfer level (RTL).

The electronics industry's increasing need for very large and complex systems has put a strain on conventional design verification methodologies. By raising the level of design capture from schematic level to register transfer level (RTL), engineers can more quickly verify and debug larger and more complex systems.

However, modeling a register in RTL introduces problems that do not exist when modeling the register at a schematic level using for example Fusion HDL. Registers provide an important fundamental building block for digital systems. In some applications, registers provide a temporary storage function. In other applications registers provide a way to synchronize data signals with timing signals to form a highly accurate timing generator. Thus, accurate modeling of registers is critical for a wide variety of applications.

FIG. 1 shows a schematic symbol for a conventional D type register 100. Register 100 includes an input signal D, an output signal Q, and a clock signal CLK. The D type register 100 further includes the ability to have its output Q preset with a predetermined condition upon reset using a clear nCLR line.

FIG. 2 shows an operational waveform for illustrating the operation of a register. The nCLR signal is used to reset the register to a zero value or some predetermined value, CLK is the input clock signal, D is the input data signal and Q is the output data signal.

A D register receives an input signal D which is transferred to its output as a function of a clock signal CLK applied to it. The output value Q of the register only changes value when the clock signal CLK changes to a digital high signal. In this case, the value of the input signal D is transferred to become the output value Q. In all other cases, the output value Q from the D register remains unchanged. The D register can be designed to switch at either a rising edge or a falling edge of the clock signal.

In normal operation, the CLK value is either a digital low or a digital high. However, during contention or tristate, the CLK value fluctuates and is unknown. Contention is the condition when more than one driver is transmitting a signal to the register CLK and the values of the signals from the drivers are not the same (i.e. one driver is sending a digital high signal while the other is sending a digital low signal), thereby creating a conflict. Tristate condition exists when the register is not receiving a clock signal but there is still voltage on the line. During tristate or contention, the clock value is floating and can be any value, i.e. 0.2 v, 0.8 v or 1.5 v. Eventually the value settles on either a digital high or a digital low or some other known value. But, the short time that the clock value is floating introduces errors in data transmission when modeling in RTL. The present invention is directed to reducing these errors.

SUMMARY OF THE INVENTION

The present invention is directed to reducing errors introduced when modeling a register in RTL. Specifically, the present invention reduces errors introduced due to tristate and contention when modeling a register in RTL. During tristate, the clock value is floating and can be any value (referred to as X in the drawings and hereafter), i.e. 0.2 v, 0.8 v or 1.5 v. Similarly, during contention, the clock value is also floating and can be any value (referred to as Z in the drawings and hereafter), i.e. 0.2 v, 0.8 v or 1.5 v.

In one embodiment, the floating X and Z values are replaced by predetermined desired values (referred to as Y hereafter). Both the X and Z values and the associated Y values are stored in a lookup table. When either an X or a Z value is detected in the clock signal, that value is replaced by the associated Y value.

In another embodiment, when an X or a Z value is detected, that value is ignored and the previous clock value is retained. Thus, if the previous clock value is a digital high signal then the clock value remains at a digital high and data transmission continues. If the previous clock value is at a digital low signal, then the clock value remains at a digital low and no data transmission takes place.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention is directed to eliminating the effects of tristate and contention during the transmission of data in a register when the register is modeled in RTL. Although the present invention is described using D-registers, those skilled in the art will appreciate that it can be used in any type of register including T registers, R-S registers, R-S-T registers, any register active at the positive edge or the negative edge, etc. Further, the RTL modeling may be done using any RTL language such as Verilog or VHDL.

In one embodiment, the floating X and Z values are replaced by predetermined desired values, Y. Both the X and Z values and the associated Y values are stored in a lookup table. When either an X or a Z value is detected in the signal, that value is replaced by the associated Y value.

In another embodiment, the X and Z values are ignored and the previous clock value is retained. Thus, if the previous clock value is a digital high signal then the clock value remains at a digital high and data transmission continues. If the previous clock value is at a digital low signal, then the clock value remains at a digital low and no data transmission takes place, that is to say that the X or Z values are not interpreted as a rising edge and therefore do not trigger data transmission.

Figure 1:
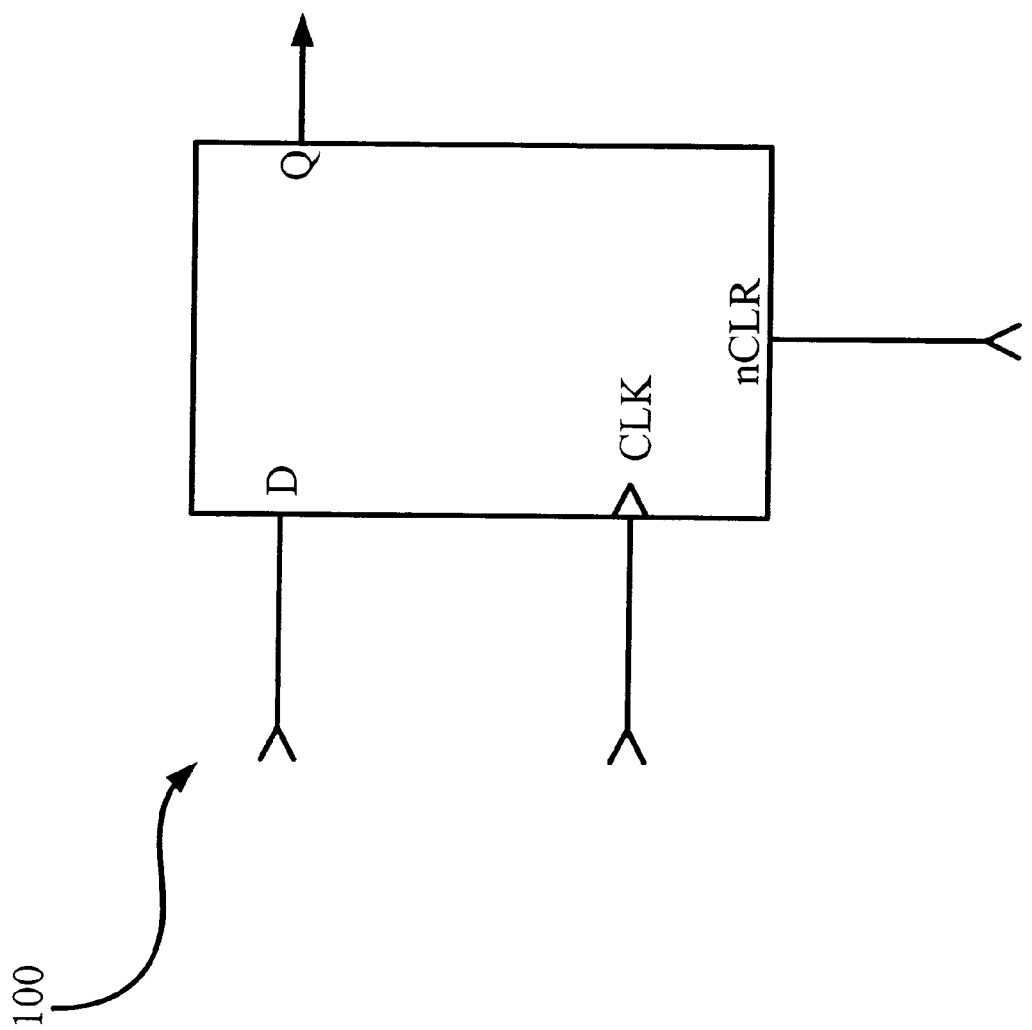
FIG. 1 shows a schematic symbol for a conventional D type register.
Figure 2:
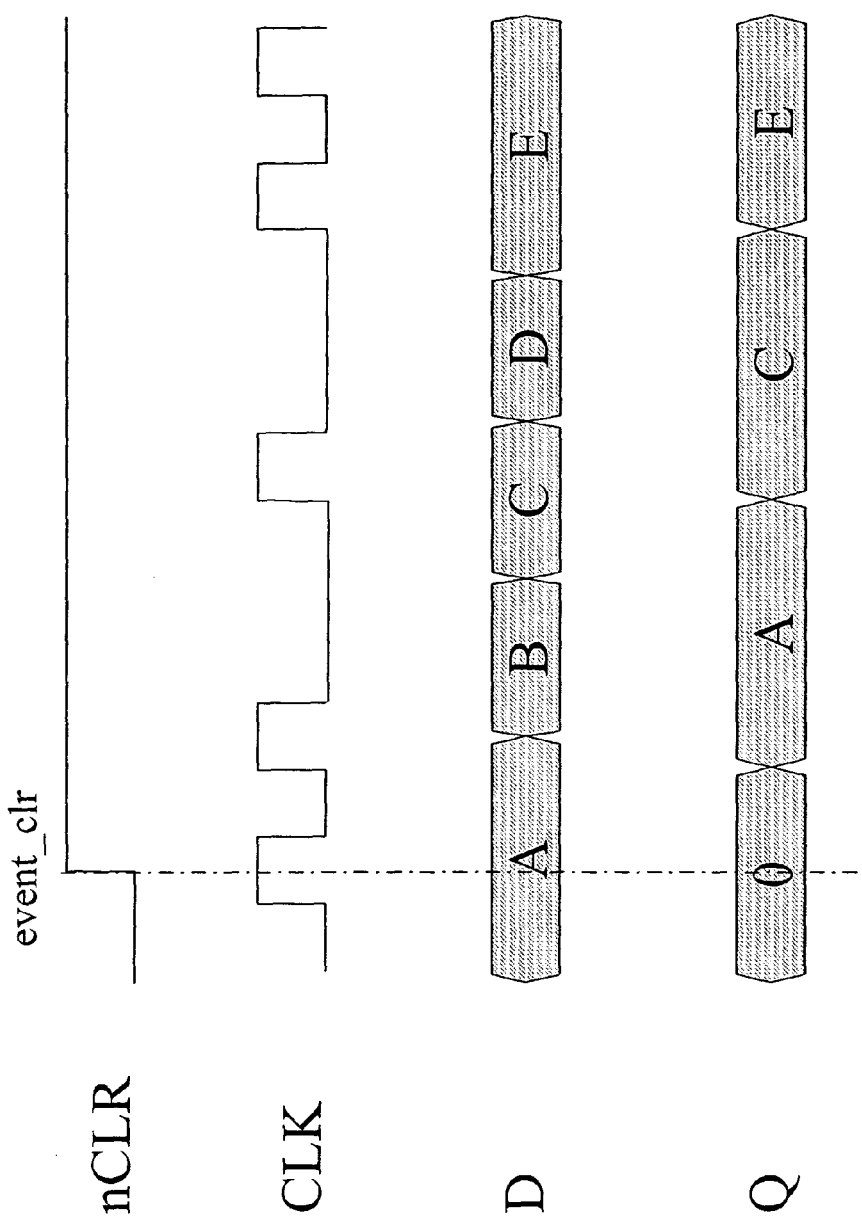
FIG. 2 shows an operational waveform for the operation of a register.
Figure 3:
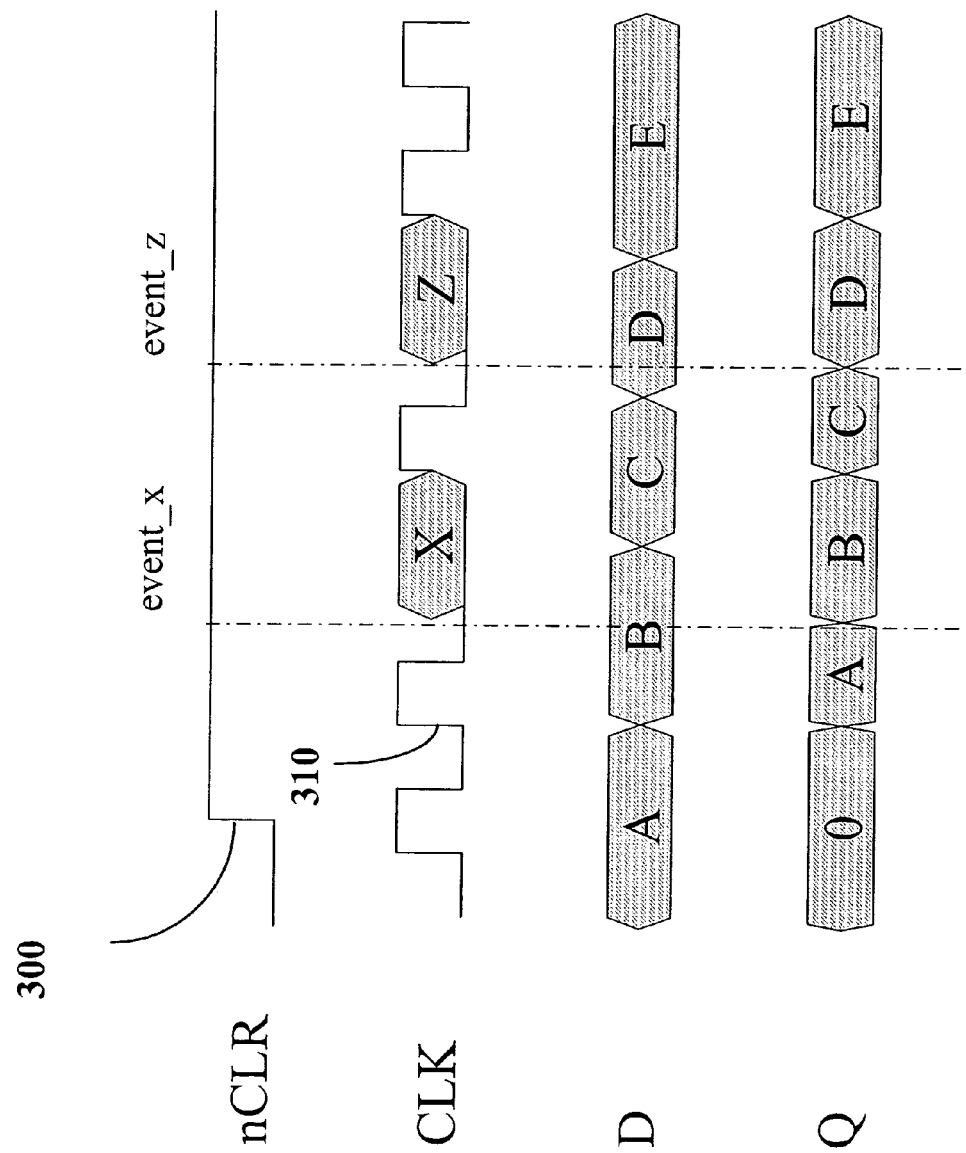
FIG. 3 illustrates an operational waveform for the operation of a register where the clock signal includes X and Z values.

FIG. 3 illustrates an operational waveform for the operation of a register where the clock signal includes X and Z values. The nCLR signal is used to reset the register to a zero value or some predetermined value, CLK is the input clock signal, D is the input data signal and Q is the output data signal.

In this embodiment, data is transmitted on the rising edge of the clock. Thus, once nCLR transitions from a logical low to a logical high 300, the register is cleared for data transmission. However, no data is transmitted until the clock has a rising edge, 310. Until that time, the Q value remains at zero. Once the clock has a rising edge 310, then data is transmitted through the register, that is, the value of Q changes from 0 to A.

As can be seen, the X and the Z values trigger data transmission even when the clock value is at a digital low because X and Z are interpreted as a rising edge of the clock.

Figure 4:
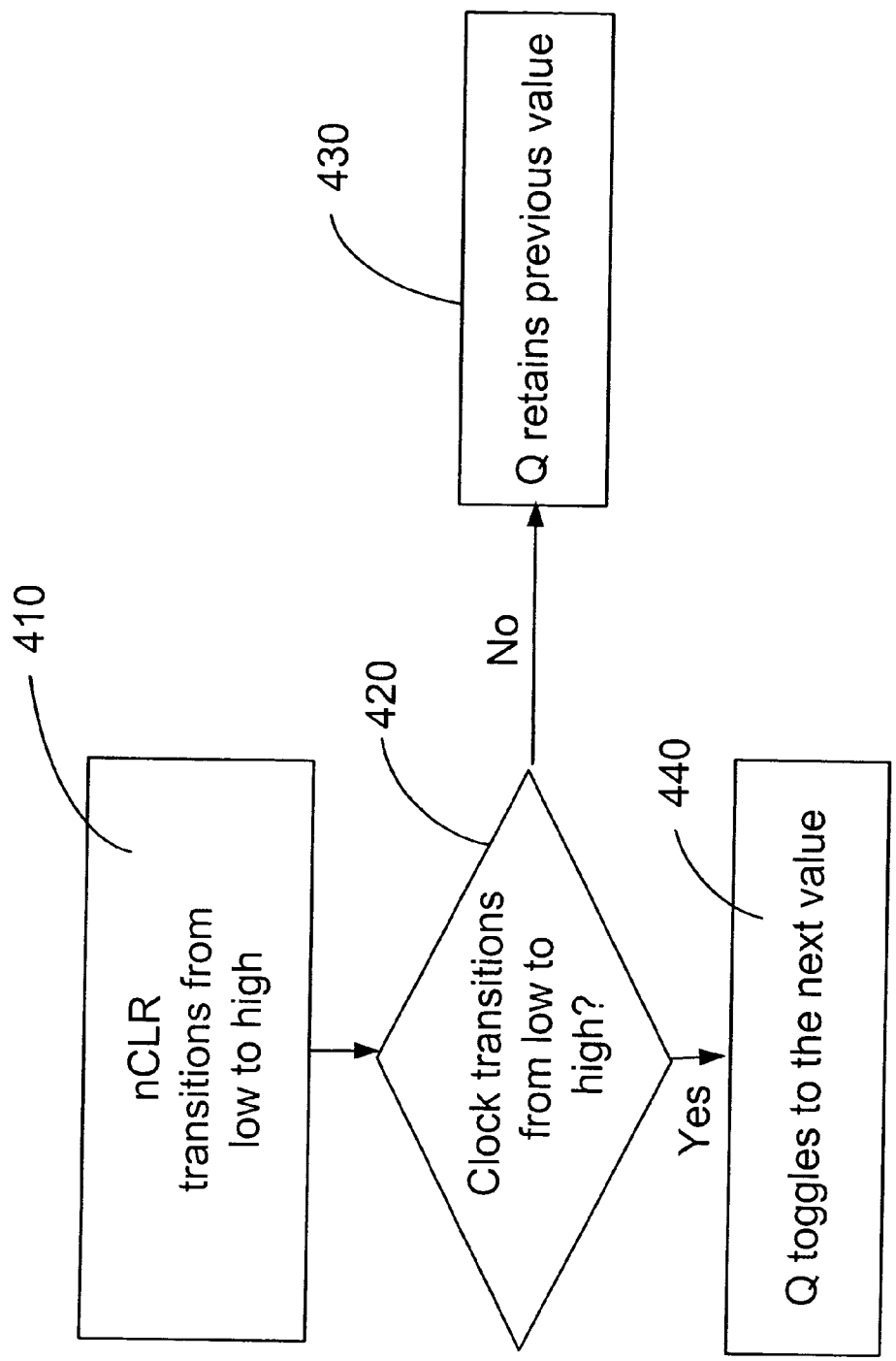
FIG. 4 is a flow chart showing the modeling of the register without the use of the present invention.

FIG. 4 is a flow chart showing the modeling of the register without the use of the present invention. In step 410, the nCLR signal transitions from a digital low to a digital high signal, thus signaling that the register is clear and ready for data transmission. Step 420 determines whether the clock signal has transitioned from a digital low to a digital high. If the clock signal transitions from a low to high, step 420—Yes, then the output value Q of the register is replaced by the next input value D in step 440. If the clock signal does not transition from a low to high, step 420—No, then the output value Q of the register is not replaced by the next input value and the register retains its previous value, step 430.

When this register is modeled at a schematic level using for example Fusion HDL, the values of X and Z are ignored. That is to say, when the system detects an X or a Z value, it retains the previous clock value. The value of clock CLK in FIG. 3 remains at a digital low and no data transmission takes place. However, when this register is modeled in RTL using for example Verilog, the values of X and Z are interpreted as a rising edge, thus triggering unintended data transmission.

Figure 5:
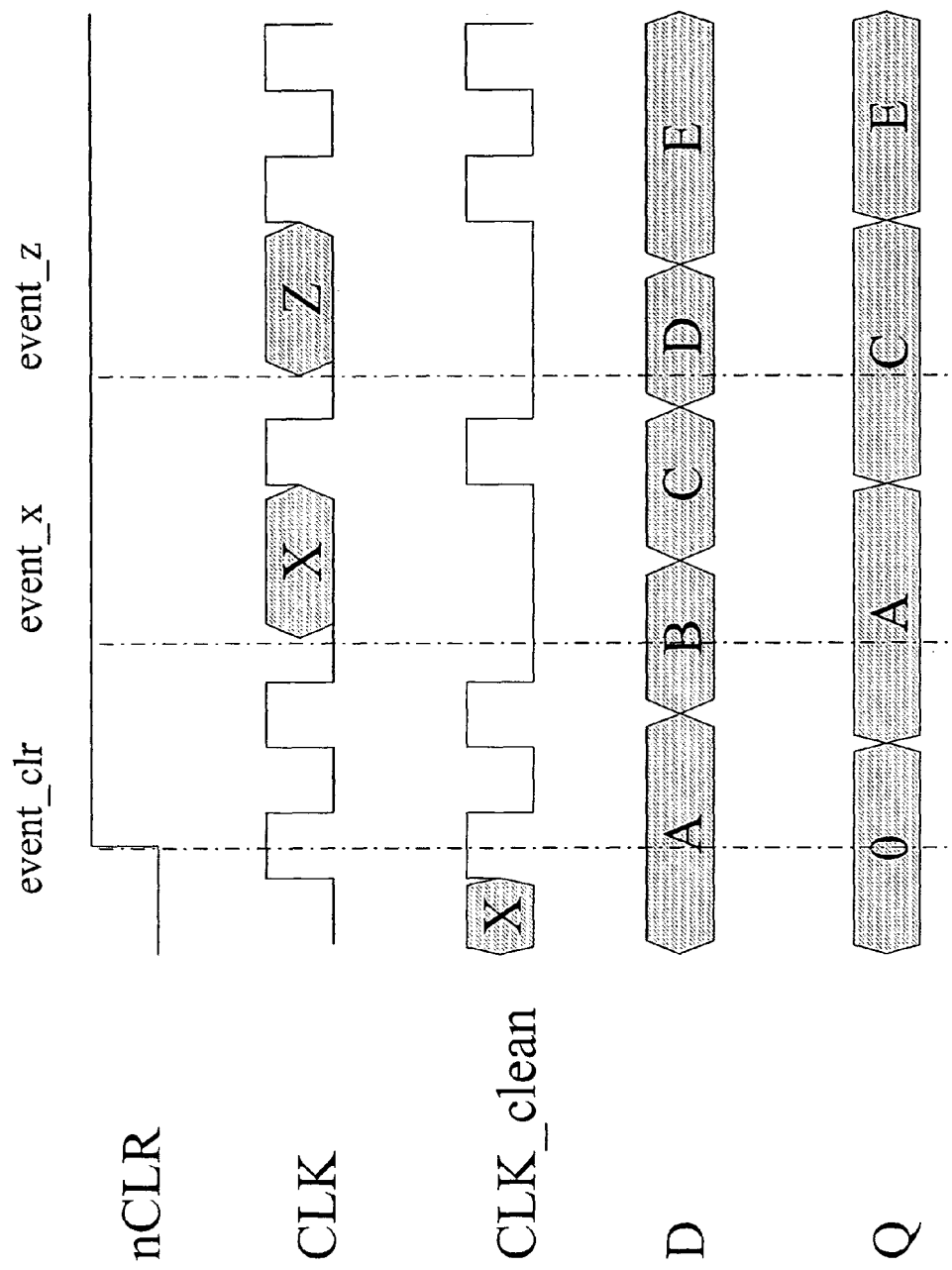
FIG. 5 illustrates an operational waveform for the operation of a register in accordance with an embodiment of the invention.

FIG. 5 illustrates an operational waveform for the operation of a register in accordance with an embodiment of the invention. The nCLR signal is used to reset the register to a zero value or some predetermined value, CLK is the input clock signal, D is the input data signal and Q is the output data signal. The CLK_clean (referred to as Y hereafter) is a clean clock signal generated to compensate for the X and Z signals. The generation of the CLK_clean signal is described in greater detail below in conjunction with FIG. 6.

The register of FIG. 5 is designed to switch at the rising edge of the clock, e.g. data is transmitted only when the clock signal transitions from a digital low signal to a digital high signal.

Figure 6:
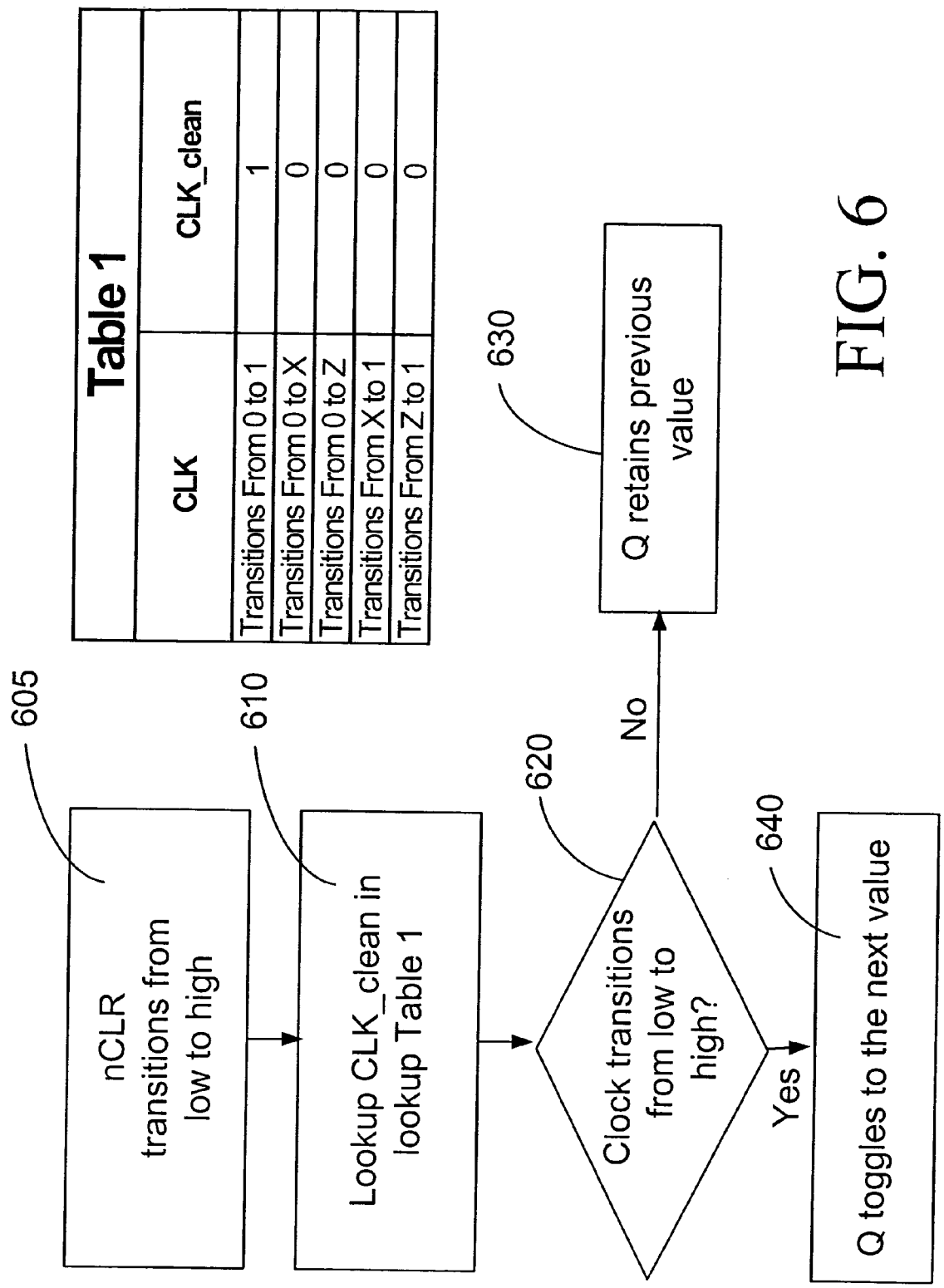
FIG. 6 is a flowchart showing the modeling of the register in accordance with an embodiment of the present invention.

FIG. 6 is a flowchart showing the modeling of the register in accordance with an embodiment of the present invention. In this embodiment, the X or Z value is replaced by desired Y values as shown in Table 1 below and in FIG. 6.

TABLE 1

| CLK | CLK_clean |
|---|---|
| Transitions From 0 to 1 | 1 |
| Transitions From 0 to X | 0 |
| Transitions From 0 to Z | 0 |
| Transitions From X to 1 | 0 |
| Transitions From Z to 1 | 0 |

In step 605, the nCLR signal transitions from a digital low to a digital high signal, thus signaling that the register is clear and ready for data transmission. In step 610, CLK_clean is generated by looking up the value corresponding to the CLK signal in Table 1. This CLK_clean is then used to process the incoming data. Step 620 determines whether the clock signal has transitioned from a digital low to a digital high. If the clock signal transitions from a low to high, step 620—Yes, then the output value Q of the register is replaced by the next input value D in step 640. If the clock signal does not transition from a low to high, step 620—No, then the output value Q of the register is not replaced by the next input value and the register retains its previous value, step 630.

One drawback of this method is that the CLK_clean does not compensate for an X or a Z value prior to the detection of the first rising edge of the clock signal. Thus, when nCLR transitions from a digital low to a digital high signal, the value of CLK_clean can still have an X or a Z value. In other words, the value for CLK_clean is not determined until the first rising edge of the clock CLK. Therefore, there could still be errors in data transmission until the first rising clock edge is detected. This problem may be addressed by assigning a predetermined value to the CLK_clean until a first rising edge is detected.

Figure 7:
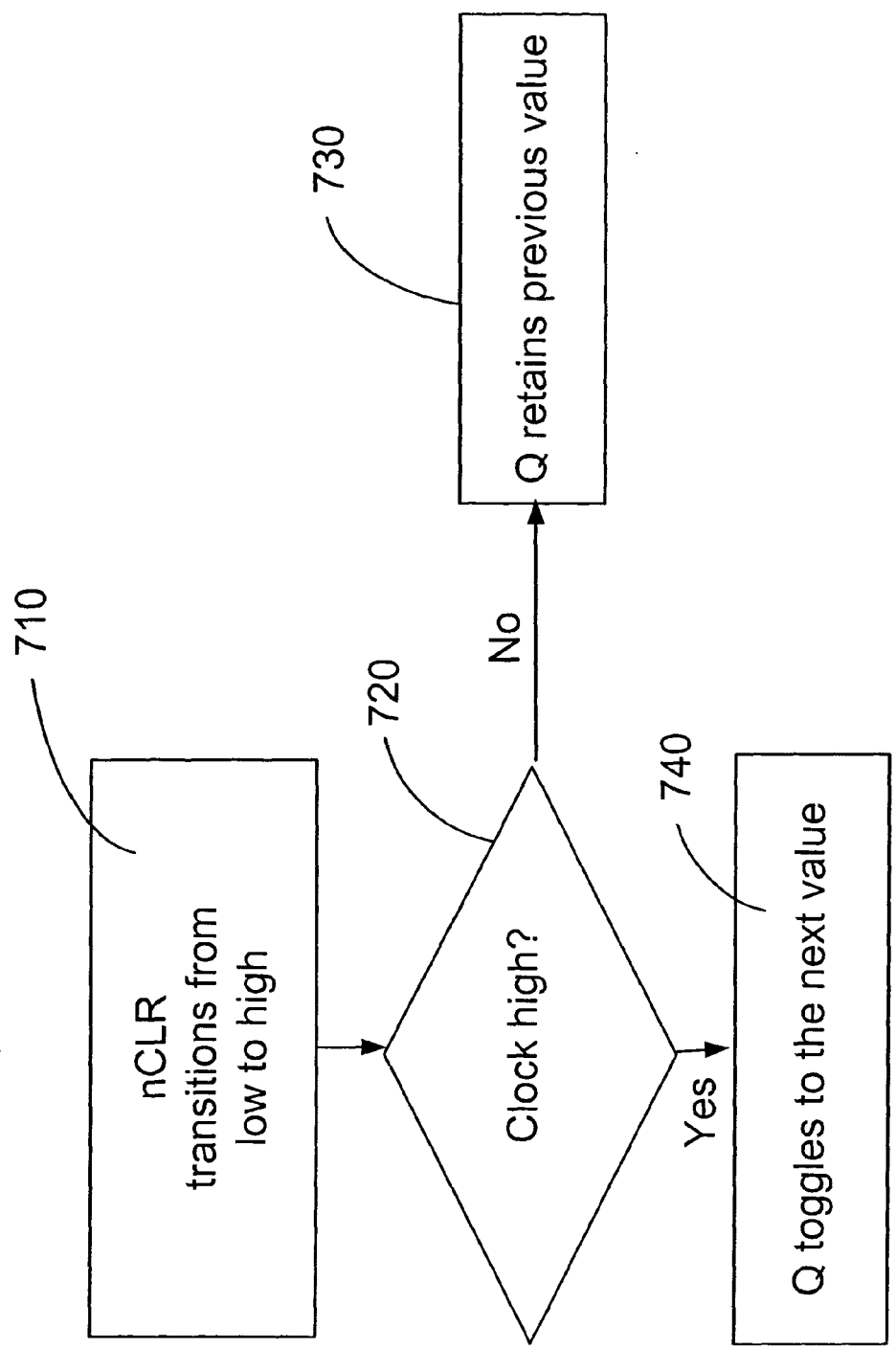
FIG. 7 is a flowchart showing the modeling of the register in accordance with another embodiment of the present invention.

FIG. 7 is a flowchart showing the modeling of the register in accordance with another embodiment of the present invention. In this embodiment, data is only transmitted when the clock value is at a digital high signal. In all other instances, no data is transmitted. Thus, no data is transmitted at X or Z values.

In step 710, the nCLR signal transitions from a digital low to a digital high signal, thus signaling that the register is clear and ready for data transmission. Step 720 determines whether the clock signal is a digital high signal. If the clock signal is a digital high signal, step 720—Yes, then the output value Q of the register is replaced by the next input value D in step 740. If the clock signal is not a digital high signal, step 720—No, then the output value Q of the register is not replaced by the next input value and the register retains its previous value, step 730. Consequently, when X or Z values are detected, these values are not interpreted as a rising edge and no unintended data transmission takes place.

The foregoing description of specific embodiments of the invention has been presented for the purposes of illustration and description. It is not intended to be exhaustive or to limit the invention to the precise form described. Many modifications and variations are possible in light of the teachings above. The embodiment were chosen and described in order to best explain the principles of the invention and its practical applications to enable others skilled in the art to best utilize the invention in various embodiments and with various modifications as are suited to the particular use contemplated.

What is claimed is:

1. A method of modeling a register in register transfer level (RTL), the register having a clock input, data input and data output, the method comprising:

determining whether a clock signal at the clock input is a digital high signal;

passing a data signal from the data input to the data output only when the clock signal at the clock input is a digital high signal, wherein the clock signal includes a floating voltage signal having a value different from a digital low or a digital high signal, wherein the floating voltage signal is due to one of contention between two or more drivers driving the clock input to the register, and a driver being tristated where the driver drives the clock input to the register; and retaining a previous data signal at the data output if the clock signal at the clock input is not a digital high signal.

2. The method of claim 1, wherein the register is a D register, a T register, an R-S register, or an R-S-T register.

3. The method of claim 1 further comprising:
passing a signal from the data input to the data output when the nCLR signal is a digital high signal.

4. A method for performing verification of an electronic circuit, the method including the method of claim 1.

5. A data processing system for performing verification of an electronic circuit, the data processing system including instructions for implementing the method of claim 1.

6. The method of claim 1, wherein the data signal is output at the data output until a different data signal is at the data input and the clock signal at the clock input is a digital high signal.

7. The method of claim 1, wherein a next data signal at the data output is a next data signal at the data input when the clock signal is a digital high signal.

8. The method of claim 1, further comprising:
determining whether the clock signal at the clock input has a floating value;
replacing the clock signal at the clock input with a non-floating value that is either a digital high value or a digital low value if the clock signal at the clock input has a floating value.

9. The method of claim 8, wherein determining whether the clock signal at the clock input has a floating value comprises identifying the clock signal on a lookup table.

10. The method of claim 8, wherein replacing the clock signal at the clock input with the non-floating value comprises identifying a non-floating value corresponding to the floating value on a lookup table.

11. A method for modeling a register, comprising:
determining whether a clock signal at a clock input of the register has a floating value,
wherein the floating value is due to one of contention between two or more drivers driving the clock input to the register, and a driver being tristated where the driver drives the clock input to the register;
replacing the clock signal at the clock input with a non-floating value, that is either a digital high value or a digital low value, if the clock signal at the clock input has a floating value; and
outputting a data signal from a data input of the register at a data output of the register when the clock signal at the clock input has a digital high value.

12. The method of claim 11, wherein determining whether the clock signal at the clock input has a floating value comprises identifying the clock signal on a lookup table.

13. The method of claim 11, wherein replacing the clock signal at the clock input with the non-floating value comprises identifying a ion-floating value corresponding to the floating value on a lookup table.

14. The method of claim 11, wherein the data signal is output at the data output until a different data signal is at the data input and the clock signal at the clock input is a digital high signal.

15. The method of claim 11, wherein a next data signal at the data output is a next data signal at the data input when the clock signal is a digital high signal.

16. The method of claim 11, wherein the floating value is neither a digital high value or a digital low value.

17. The method of claim 11, wherein the register is modeled in register transfer level.

18. A method of modeling a register, comprising:
determining whether a clock signal at a clock input is a digital high signal;
passing a data signal from a data input to a data output of the register only when the clock signal at the clock input is a digital high signal, wherein the clock signal includes a floating voltage signal having a value different from a digital low or a digital high signal,
wherein the floating voltage signal is due to one of contention between two or more drivers driving the clock input to the register, and a driver being tristated where the driver drives the clock input to the register; and
retaining a previous data signal at the data output if the clock signal at the clock input is not a digital high signal and outputting the previous data signal at the data output until a different data signal is at the data input and the clock signal at the clock input is a digital high signal, wherein a next data signal at the data output is a next data signal at the data input when the clock signal is a digital high signal.

* * * * *